United States Patent [19]
Baum

[11] Patent Number: 5,457,403
[45] Date of Patent: Oct. 10, 1995

[54] FAULT TOLERANT AND GATE CIRCUIT

[75] Inventor: Eric B. Baum, Princeton, N.J.

[73] Assignee: NEC Research Institute, Inc., Princeton, N.J.

[21] Appl. No.: 362,096

[22] Filed: Dec. 22, 1994

[51] Int. Cl.$^6$ ............................................. H03K 19/003
[52] U.S. Cl. ........................................ 326/11; 326/104
[58] Field of Search ................................ 326/9, 10, 11, 326/104

[56] References Cited

U.S. PATENT DOCUMENTS

| | | | |
|---|---|---|---|
| 2,942,193 | 6/1960 | Tryon | 326/11 |
| 3,134,032 | 5/1964 | Mann | 326/11 |
| 3,201,701 | 8/1965 | Maitra | 326/11 |
| 3,543,048 | 11/1970 | Klaschka | 326/10 |

OTHER PUBLICATIONS

"Digital Design, Principles and Practices" by John F. Wakerly © 1989 by John F. Wakerly, pp. 129–130.

D. Kleitman et al, "On the Design of Reliable Boolean Circuits that Contain Partially Unreliable Gates" Proceedings from 35th Ann. Symp. on Foundations of Computer Sci., Nov. 20–22, 1994, pp. 332–346.

Primary Examiner—Edward P. Westin
Assistant Examiner—Benjamin D. Driscoll
Attorney, Agent, or Firm—Philip J. Feig

[57] ABSTRACT

A k-fault tolerant AND gate circuit comprises k+1 levels and the input level comprises k+1 AND gates. Embodiments provide intermediate levels arranged for providing a two-fault tolerant AND gate circuit and a four-fault tolerant AND gate circuit, respectively.

3 Claims, 1 Drawing Sheet

FAULT TOLERANT AND GATE CIRCUIT

FIELD OF THE INVENTION

The present invention relates to fault tolerant AND gate circuits and particularly, to two-fault tolerant AND gate circuits and four-fault tolerant AND gate circuits.

BACKGROUND OF THE INVENTION

Fault tolerant circuit design is becoming increasingly important as integrated circuits and computer chips become more complex and more expensive to fabricate.

The effect of a defective gate detected during fabrication is the scrapping of the chip. A defective gate in a hostile environment, where repair is impossible or impractical or in a critical application, can result in a catastrophe, for example, in outer space or in a life-support system.

Fault-tolerant design, in general, is known. In some instances redundant gates and circuits arc added to the circuit &sign layout. The addition of redundancy results in a portion of the chip or wafer area being used for redundant circuits rather than being used for additional circuits. Such results are undesirable and inefficient due to the wafer area overhead costs.

Fault tolerant gate circuits are described in an article by D. Kleitman et al entitled "On the Design of Reliable Boolean Circuits that Contain Partially Unreliable Gates" in the Proceedings of the 35th Annual Symposium on Foundations of Computer Science, Nov. 20–22, 1994, pages 332–346. Designs for k-fault tolerant gate circuits, where k is $2^n-1$ for n>0, are disclosed. A simple fault tolerant design comprising three gates, which design may be iteratively repeated for k-fault tolerant designs, is described. As is often the situation, after a relatively low value of k, for example three-fault tolerant design, the quantity of gates required for implementation of the fault tolerant design becomes an important consideration. As the quantity of additional gates required increases, the circuit reliability decreases and the chip area required for the additional gates increase. The iteratively repeated embodiment does not necessarily yield an optimal result for k greater than about three.

SUMMARY OF THE INVENTION

The present invention provides optimal designs for a two-fault tolerant AND gate circuit and a four-fault tolerant AND gate circuit. More fault tolerant designs are possible, but the quantity of gates required and the resultant chip area required makes such design infeasible.

In the following description, it will be assumed that the fault mode is the short circuiting of the output of an AND gate to one of its respective inputs. Any other type of fault would not be protected by the present invention. The AND gate circuit comprises a plurality of individual AND gates.

A two-fault tolerant AND gate refers to the fact that even if up to two AND gates of the AND gate circuit fail, i.e. a failure is a gate having a short circuit from its output to one of its inputs, the output will be the Boolean AND of the two input signals to the AND gate circuit. Likewise, a four-tolerant AND gate refers to the situation that even if up to four AND gates of the AND gate circuit fail, the output of the AND gate circuit will be the Boolean AND of the two input signals to the AND gate circuit.

A first constraint of the optimal k-fault tolerant design is that the first level (input level) of AND gates comprises k+1 AND gates, i.e., three AND gates for the two-fault tolerant AND gate and five AND gates for the four-fault tolerant AND gate. Such a design provides that at least one input level AND gate will not be faulty.

A second constraint of the optimal k-fault tolerant design is that the number of levels comprising the AND gate circuit be k+1 so that a direct short from an input to the output cannot occur through k or less serially connected AND gates. Applying these constraints results in a two-fault tolerant AND gate circuit comprising 6 AND gates and a four-fault tolerant AND gate circuit comprising 14 AND gates. As mentioned above, for higher fault tolerant AND gate circuits the number of AND gates comprising the circuit becomes too great to be of practical use.

A principal object of the present invention is therefore, the provision of an optimal k-fault tolerant AND gate circuit design.

Another object of the invention is the provision of a two-fault tolerant AND gate circuit design.

A further object of the invention is the provision of a four-fault tolerant AND gate circuit design.

Further and still other objects of the present invention will become more clearly apparent when the following description is read in conjunction with the accompanying drawing.

DETAILED DESCRIPTION OF THE INVENTION

Figure 1:
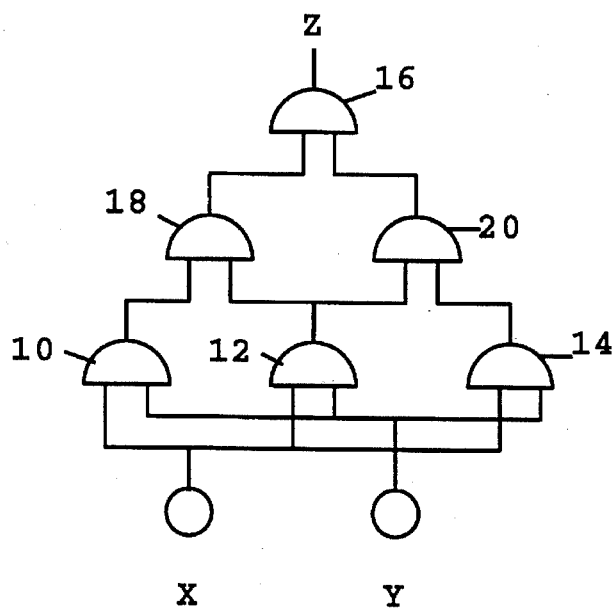
FIG. 1 is a schematic circuit diagram of a two-fault tolerant AND gate circuit.

Referring now to the figures and to FIG. 1 in particular, there is shown a schematic circuit diagram of a preferred embodiment of an optimal two-fault tolerant AND gate circuit. The inputs to the circuit are signals X and Y. The output of the AND gate is labeled as signal Z, where Z=X AND Y.

In accordance with the first of the above constraints, the first level (input level) of the two-fault tolerant AND gate circuit comprises three AND gates 10, 12 and 14. Each AND gate 10, 12 and 14 receives input signals X and Y. If any two of the first level AND gates have a fault, the third AND gate will still perform correctly.

In accordance with the second of the above constraints, the output AND gate 16 is at a third level. The three level structure assures that there cannot be a direct short circuit from the input to tile output if two serially connected AND gates are faulty.

The intermediate level comprises AND gates 18 and 20. The inputs to AND gate 18 are the outputs of AND gates 10 and 12. The inputs to AND gate 20 are the outputs of AND gates 12 and 14. The outputs of the intermediate level AND gates 18 and 20 are the respective inputs to AND gate 16. The output of AND gate 16 is the Boolean AND function of the two input signals X and Y.

The two-fault tolerant AND gate in FIG. 1 will provide as its output the Boolean AND of input signals X and Y if up to any two of the AND gates comprising the circuit are faulty, i.e. have a short circuit from an output of an AND gate to one of its respective inputs. If more than two AND gates are faulty, the two-fault tolerant AND circuit is not expected to perform properly.

Figure 2:
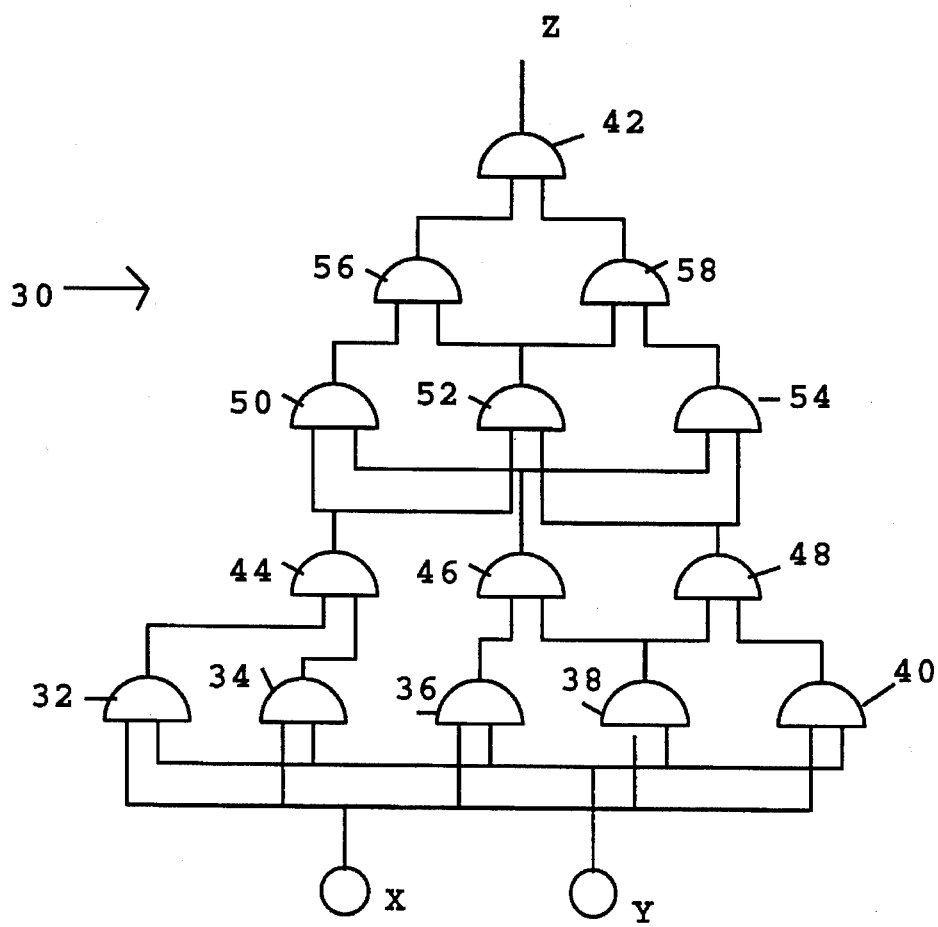
FIG. 2 is a schematic circuit diagram of a four-fault tolerant AND gate circuit.

FIG. 2 is a schematic circuit diagram of a four-fault tolerant AND gate circuit 30. The first level of AND gate circuit 30 comprises five (k+1) AND gates 32, 34, 36, 38 and 40. Each of the first level AND gates has as its respective inputs the signals X and Y. There are a total of five (k+1) levels, terminating in output AND gate 42. The output of AND gate 42 is the Boolean AND of the signals X and Y if up to four of the 14 gates comprising the AND gate circuit 30 fail by short circuiting of an output of an AND gate to one of its respective inputs.

The second level of the four-fault tolerant AND gate 30 comprises three AND gates 44, 46 and 48. The inputs to AND gate 44 are the outputs of AND gates 32 and 34. The inputs to AND gates 46 are the outputs of AND gates 36 and 38. The inputs to AND gate 48 are the outputs of AND gates 38 and 40. The third level of AND gate circuit 30 comprises three AND gates 50, 52 and 54. The inputs of AND gate 50 are the outputs of AND gates 44 and 46. The inputs of AND gate 52 are the outputs of AND gates 44 and 48. The inputs of AND gate 54 are the outputs of AND gates 46 and 48.

The fourth level of the four-fault tolerant AND gate circuit 30 comprises AND gates 56 and 58. The inputs to AND gate 56 are the outputs of AND gates 50 and 52. The inputs of AND gate 58 are the outputs of AND gates 52 and 54. The outputs of AND gates 56 and 58 are the inputs of the output AND gate 42.

If any four of the AND gates comprising the four-fault tolerant AND gate circuit 30 have a short circuit from its output to one of its respective inputs, the output Z will still be the Boolean AND of the input signals X and Y. If more than four AND gates are faulty, the four-fault tolerant AND gate circuit is not expected to perform properly.

The third, fourth and output levels of the four-fault tolerant AND gate circuit is configured the same as the two-fault tolerant AND gate circuit shown in FIG. 1.

The fault tolerant AND gates shown in FIGS. 1 and 2 are optimal designs for a two-fault tolerant AND gate circuit and a four-fault tolerant AND gate circuit. As mentioned heretofore, any higher value fault tolerant AND gate circuit design would contain too many AND gates to be of practical use. It is believed that the present invention provides an optimal design for the commonly encountered two-fault tolerant AND gate circuit and an optimal design for a four-fault tolerant AND gate circuit.

While there has been described and illustrated preferred embodiments for an optimal two-fault tolerant AND gate circuit design and an optimal four-fault tolerant AND gate circuit design, it will be apparent to those skilled in the art that variations and modifications are possible without deviating from the broad principle and spirit of the present invention, which shall be limited solely by the scope of the claims appended hereto.

What is claimed is:

1. A two-fault tolerant AND gate circuit comprising:

an input level of said AND gate circuit comprising three AND gates;

an output AND gate comprising a third level of said AND gate circuit; and second level of said AND gate circuit comprising two AND gates, where each AND gate comprising said input level is adapted for receiving at its respective inputs an input signal X and an input signal Y, the inputs to a first one of said AND gates comprising said second level being the outputs of two of said AND gates comprising said input level and the inputs to a second one of said AND gates comprising said second level being the output of the remaining one of said AND gates comprising said input level and the output of one of the two of said AND gates in said input level, the input of said output AND gate being the outputs of the AND gates comprising said second level.

2. A four-fault tolerant AND gate circuit comprising:

an input level of said AND gate circuit comprising five AND gates;

second level of said AND gate circuit comprising three AND gates;

third level of said AND gate circuit comprising three AND gates;

fourth level of said AND gate circuit comprising two AND gates; and an output AND gate comprising a fifth level of said AND gate circuit, where each AND gate comprising said input level is adapted for receiving at its respective inputs an input signal X and an input signal Y, the input signals of a first one of said three AND gates comprising said second level being the outputs of a first two of said five AND gates comprising said input level, the input signals of a second of said three AND gates comprising said second level being the outputs another two of said five AND gates comprise said input level, the input signals of the third of said three AND gates comprising said second level being the output of the remaining one of said five AND gates comprising said input level and the output of another of said five AND gates comprising said input level, the inputs of a first of said three AND gates comprising said third level being the outputs of said first and second AND gates comprising said second level, the inputs of a second of said three AND gates comprising said third level being the output of said first and third AND gates comprising said second level, and the input of said third AND gate comprising said third level being the output of said second and third AND gates comprising said second level, the inputs of one of said two AND gates comprising said fourth level being the outputs of said first and second AND gates comprising said third level and the inputs of the other of said two AND gates comprising said fourth level being the outputs of said second and third AND gates of said third level, the inputs to said output AND gate being the outputs comprising said two AND gates comprising said fourth level.

3. A four-fault tolerant AND gate circuit as set forth in claim 2, where said third, fourth and output levels comprise a two-fault tolerant AND gate circuit.

\* \* \* \* \*